(12) United States Patent
Bae et al.

(10) Patent No.: US 12,175,914 B2
(45) Date of Patent: Dec. 24, 2024

(54) DISPLAY APPARATUS AND SHIFT RESISTER REPAIRING METHOD

(71) Applicant: Samsung Display Co., Ltd., Yongin-Si (KR)

(72) Inventors: Joon Woo Bae, Yongin-si (KR); Dong Min Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 18/139,255

(22) Filed: Apr. 25, 2023

(65) Prior Publication Data

US 2024/0062700 A1 Feb. 22, 2024

(30) Foreign Application Priority Data

Aug. 16, 2022 (KR) .................. 10-2022-0102095

(51) Int. Cl.
*G09G 3/20* (2006.01)
*G09G 3/00* (2006.01)
*G11C 19/28* (2006.01)

(52) U.S. Cl.
CPC ............ *G09G 3/2092* (2013.01); *G09G 3/006* (2013.01); *G11C 19/28* (2013.01); *G09G 2310/0267* (2013.01); *G09G 2310/0286* (2013.01); *G09G 2330/12* (2013.01)

(58) Field of Classification Search
CPC ...................................................... G09G 3/006
See application file for complete search history.

(56) References Cited

U.S. PATENT DOCUMENTS

| 6,100,865 A * | 8/2000 | Sasaki ................. G09G 3/3648 345/98 |
| 8,339,349 B2 | 12/2012 | Shin et al. |
| 2011/0207251 A1* | 8/2011 | Anzai ................. H01L 27/1266 257/E21.705 |
| 2023/0316967 A1* | 10/2023 | Otose ...................... G09G 3/20 345/214 |

FOREIGN PATENT DOCUMENTS

| CN | 108173176 A | 6/2018 |
| KR | 10-1149410 B1 | 6/2012 |
| KR | 10-2012-0075126 A | 7/2012 |
| KR | 10-1286523 B1 | 7/2013 |
| KR | 10-1303736 B1 | 9/2013 |
| KR | 10-2361309 B1 | 2/2022 |

* cited by examiner

*Primary Examiner* — Nan-Ying Yang
(74) *Attorney, Agent, or Firm* — Innovation Counsel LLP

(57) ABSTRACT

Provided is a display device including a display panel configured to include a plurality of pixels positioned on a first substrate and a plurality of scan lines positioned along a first direction; and a plurality of shift registers configured to receive a plurality of clock signals and a start signal, to generate a plurality of scan signals, and to transfer the scan signals to the scan lines, wherein a first shift register among the shift registers is positioned on a second substrate, and is connected to an adjacent second shift register positioned on the first substrate among the shift registers and a corresponding scan line through a contact hole formed in the second substrate.

14 Claims, 10 Drawing Sheets

DISPLAY APPARATUS AND SHIFT RESISTER REPAIRING METHOD

CROSS-REFERENCE TO RELATED APPLICATION

This application claims priority to and the benefit of Korean Patent Application No. 10-2022-0102095, filed in the Korean Intellectual Property Office on Aug. 16, 2022, the entire contents of which are incorporated herein by reference.

BACKGROUND

1. Field

The present disclosure generally relates to a display device and a shift register repairing method. More particularly, the present disclosure relates to a display device in which a line of a shift register requiring replacement is cut and a replacement shift register mounted in a separate substrate is transplanted.

2. Description of the Related Art

When a failure occurs in a shift register in a substrate, a panel corresponding to the substrate is rejected. Even when only one of the shift registers mounted in the substrate is defective, the entire panel is treated as defective and a yield thereof is lowered.

SUMMARY

The present disclosure may provide a display device in which a line of a shift register requiring replacement is cut and a replacement shift register mounted in a separate substrate is transplanted.

The present disclosure may provide a display device in which a replacement shift register mounted in a separate substrate is transplanted without cutting a line of a shift register requiring replacement.

The present disclosure may provide a shift register repairing method in which a replacement shift register mounted in a separate substrate is transplanted to correspond to a shift register requiring replacement.

An example embodiment of the present disclosure provides a display device including: a display panel configured to include a plurality of pixels positioned on a first substrate and a plurality of scan lines positioned along a first direction; and a plurality of shift registers configured to receive a plurality of clock signals and a start signal, to generate a plurality of scan signals, and to transfer the scan signals to the scan lines, wherein a first shift register among the shift registers is positioned on a second substrate, and is connected to an adjacent second shift register positioned on the first substrate among the shift registers and a corresponding scan line through a hole formed in the second substrate.

Each of a plurality of pins of the first shift register may be connected to a pad through the hole, and the pad may be connected to the second shift register and the corresponding scan line.

The second shift register may be a shift register positioned in an immediately preceding stage of the first shift register, and the first shift register may receive a first scan signal output from the second shift register as a start signal and output at least one cycle of one of a plurality of clock signals as a second scan signal in synchronization with the first scan signal.

The second shift register may be a shift register positioned in an immediately following stage of the first shift register, and the second shift register may receive a first scan signal output from the first shift register as a start signal and output at least one cycle of one of a plurality of clock signals as a second scan signal in synchronization with the first scan signal.

Input and output lines of the first shift register may be connected to a corresponding one of input and output lines of a third shift register adjacent to the second shift register among the shift registers.

Each of a plurality of pins of the first shift register may be connected to a pad through the hole, and the pad may be connected to a corresponding one of the input and output lines of the third shift register.

Another embodiment of the present disclosure provides a shift register repairing method, including: receiving, by an inspection device, a plurality of clock signals and a start signal, generating a plurality of scan signals, and inspecting performance of a plurality of shift registers for transferring the scan signals to a plurality of scan lines positioned in a first direction in a display panel positioned on a first substrate; selecting, by the inspection device, a first shift register from among the shift registers based on the performance of the shift register; separating, by the inspection device, a region corresponding to a second shift register positioned on a second substrate from the second substrate; and transplanting, by the inspection device, the region corresponding to the second shift register to the first substrate.

The inspecting may include: displaying, by a display device including the display panel, a test image depending on a test image signal; and photographing, by the inspection device, the test image to find a pixel row that does not emit light depending on the test image signal from the test image.

The first shift register may be a shift register connected to the pixel row that does not emit light among the shift registers.

The transplanting may include connecting the second shift register to input and output lines of the first shift register through a hole formed in a region corresponding to the second shift register.

It may further include receiving, by the second shift register, a first scan signal outputted from a third shift register positioned in an immediately preceding stage of the first shift register among the shift registers as a start signal, and outputting at least one cycle of one of the clock signals as a second scan signal in synchronization with the first scan signal.

It may further include receiving, by a third shift register positioned in an immediately following stage of the first shift register among the shift registers, the first scan signal outputted from the second shift register as a start signal, and outputting at least one cycle of one of the clock signals as a second scan signal in synchronization with the first scan signal.

Another embodiment of the present disclosure provides a shift register repairing method, including: receiving, by an inspection device, a plurality of clock signals and a start signal, generating a plurality of scan signals, and inspecting performance of a plurality of shift registers for transferring the scan signals to a plurality of scan lines positioned in a first direction in a display panel positioned on a first substrate; selecting, by the inspection device, one first shift register from among the shift registers based on the performance of the shift register; cutting, by the inspection device, input and output lines of the first shift register; separating, by the inspection device, a region corresponding to a second shift register positioned on a second substrate from the second substrate; and transplanting, by the inspection device, a region corresponding to the second shift register to a line remaining on the first substrate after being cut among input and output lines of the first shift register.

The inspecting may include: displaying, by a display device including the display panel, a test image depending on a test image signal; and photographing, by the inspection device, the test image to find a pixel row that does not emit light depending on the test image signal from the test image.

The first shift register may be a shift register connected to the pixel row that does not emit light among the shift registers.

The cutting of the input and output lines of the first shift register may include: laser cutting the input and output lines of the first shift register; and removing the first shift register from the first substrate.

Each of a plurality of pins of the second shift register may be connected to a pad through a hole formed in a region corresponding to the second shift register, and the transplanting may include connecting the pad to a line remaining on the first substrate among input and output lines of the first shift register.

The region corresponding to the second shift register may include: a plurality of holes into which a plurality of pins of the second shift register are inserted; and a plurality of pads connecting the pins to a wire patterned in the first substrate.

It may further include receiving, by the second shift register, a first scan signal outputted from a third shift register positioned in an immediately preceding stage of the first shift register as a start signal, and outputting at least one cycle of one of the clock signals as a second scan signal in synchronization with the first scan signal.

It may further include receiving, by a third shift register positioned in an immediately following stage of the first shift register, the first scan signal outputted from the second shift register as a start signal, and outputting at least one cycle of one of the clock signals as a second scan signal in synchronization with the first scan signal.

According to the present disclosure, it is possible to solve a panel failure caused by one shift register failure by connecting a replacement shift register mounted in a separate substrate to a main substrate.

According to the present disclosure, a yield of a panel may be improved.

According to the present disclosure, when one shift register is defective, a panel may be used without rejecting the panel.

DETAILED DESCRIPTION OF THE EMBODIMENTS

Figure 1:
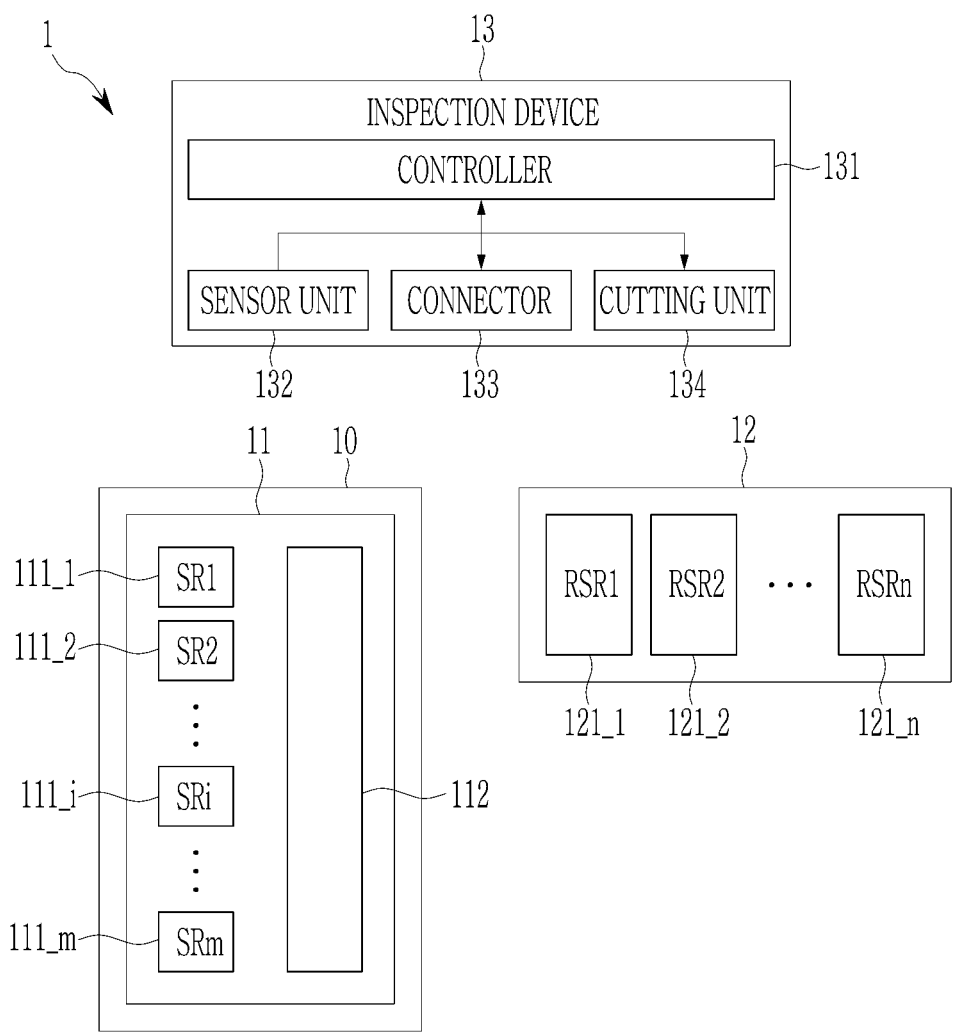
FIG. 1 illustrates a block diagram schematically showing a configuration of a shift register transplantation system according to an embodiment.

Hereinafter, embodiments disclosed in the present specification will be described in detail with reference to the accompanying drawings. In the present specification, the same or similar components will be denoted by the same or similar reference numerals, and a repeated description thereof will be omitted. Terms "module" and/or "unit" for components used in the following description are used only in order to easily describe the specification. Therefore, these terms do not have meanings or roles that distinguish them from each other in and of themselves. In describing embodiments of the present specification, when it is determined that a detailed description of the well-known art associated with the present disclosure may obscure the gist of the present disclosure, it will be omitted. The accompanying drawings are provided only in order to allow embodiments disclosed in the present specification to be easily understood and are not to be interpreted as limiting the spirit disclosed in the present specification, and it is to be understood that the present disclosure includes all modifications, equivalents, and substitutions without departing from the scope and spirit of the present disclosure.

Terms including ordinal numbers such as first, second, and the like will be used only to describe various components, and are not to be interpreted as limiting these components. The terms are only used to differentiate one component from other components.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof.

To clearly describe the present disclosure, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means when an object portion is viewed from above, and the phrase "in a cross-sectional view" means when a cross-section taken by vertically cutting an object portion is viewed from the side.

A program implemented as a set of commands embodying a control algorithm necessary for controlling a second element may be installed in a first element for controlling the second element under a specific control condition among elements according to an embodiment. A control element may process input data and stored data depending on an installed program to generate output data. The control element may include a non-volatile memory to store a program and a memory to store data.

The shift register transplantation system and method using the transplantation substrate will be described below with reference to the drawings.

FIG. 1 illustrates a block diagram schematically showing a configuration of a shift register transplantation system according to an embodiment.

The shift register transplantation system 1 includes a transplantation substrate 12 and an inspection device 13, and may operate with respect to the display device 10. The display device 10 may include a main substrate 11.

Various elements (not illustrated) for driving the display device 10 may be mounted in the main substrate 11.

The main substrate 11 may be an insulating substrate including glass, a polymer, or stainless steel. The main substrate 11 may be flexible, stretchable, foldable, bendable, or rollable. As the main substrate 11 may be flexible, stretchable, foldable, bendable, or rollable, the display device 10 may be entirely flexible, stretchable, foldable, bendable, or rollable. For example, the main substrate 11 may have a form of a flexible film including a resin such as a polyimide (PI).

A plurality of shift registers (SR) 111_1 to 111_$m$ (m being a natural number equal to or greater than 2) may be mounted in the main substrate 11. Hereinafter, a shift register requiring replacement among the shift registers 111_1 to 111_$m$ may be referred to as a target shift register 111_$i$ (i may be a natural number equal to or greater than 1 and equal to or less than m). The main substrate 11 may further include a display panel 112. A type of the display panel may be not particularly limited, and it may include various display panels such as a liquid crystal display panel, an organic light emitting display panel, an electrophoretic display panel, and an electrowetting display panel. The shift register may supply a scan signal to a plurality of scan lines positioned to correspond to each of a plurality of pixel rows of the display device 10.

The transplantation substrate 12 may be flexible, stretchable, foldable, bendable, or rollable. For example, the transplantation substrate 12 may have a form of a flexible film including a resin such as a polyimide.

The implanted substrate 12 may include a plurality of replacement shift registers (RSR) 121_1 to 121_$n$ (n may be a natural number). Hereinafter, a replacement shift register to be implanted on the main substrate 11 among the replacement shift registers 121_1 to 121_$n$ may be referred to as a target replacement shift register 121_$j$ (j may be a natural number greater than or equal to 1 and less than or equal to n).

The inspection device 13 may inspect performance of the main substrate 11, may cut the target shift register 111_$i$ from the main substrate 11, may cut the target replacement shift register 121_$j$ from the transplantation substrate 12, and may connect the target replacement shift register 121_$j$ to the main substrate 11. The inspection device 13 may include a controller 131, a sensor unit 132, a connector 133, and a cutting unit 134.

The controller 131 may control driving of the sensor unit 132, the connector 133, and the cut unit 134.

The sensor unit 132 may inspect performance of the shift registers 111_1 to 111_$n$. The sensor unit 132 may determine whether each of the shift registers 111_1-111_$n$ may be defective through an array test. In the array test, when the shift registers 111_1 to 111_$n$ to be tested are driven, a pixel row in which an image may be not displayed may be detected by detecting an image displayed on the display device 10, and it may be determined that the shift register connected to the detected pixel row may be defective. For example, for the array test, the display device 10 may display a test image depending on a test image signal. The sensor unit 132 may photograph a test image to find a pixel row that does not emit light depending on the test image signal in the test image, and may determine that a shift register connected to the pixel row may be defective.

The controller 131 may determine, as the target shift register 111_$i$, a shift register corresponding to the array detected by the sensor unit 132 as abnormally operating among the shift registers 111_1 to 111_$n$.

The connector 133 may include a connection means for connecting the target replacement shift register 121_$j$ to the main substrate 11.

The cutting unit 134 may include a cutting means for cutting the input and output lines of the target shift register 111_$i$ on the main substrate 11, or for separating a region corresponding to the target replacement shift register 121_$j$ in the transplantation substrate 12 from the transplantation substrate 12. For example, the cutting unit 134 may laser cut the input and output lines of the target shift register 121_$i$. The cutting unit 134 may laser cut a region corresponding to the target replacement shift register 121_$j$ from the transplantation substrate 12.

Hereinafter, the transplantation substrate 12 will be described in detail with reference to FIG. 2A, FIG. 2B, FIG. 2C, and FIG. 2D. Hereinafter, for convenience of description, it may be assumed that n, which may be a number of replacement shift registers, may be 4.

Figure 2A:
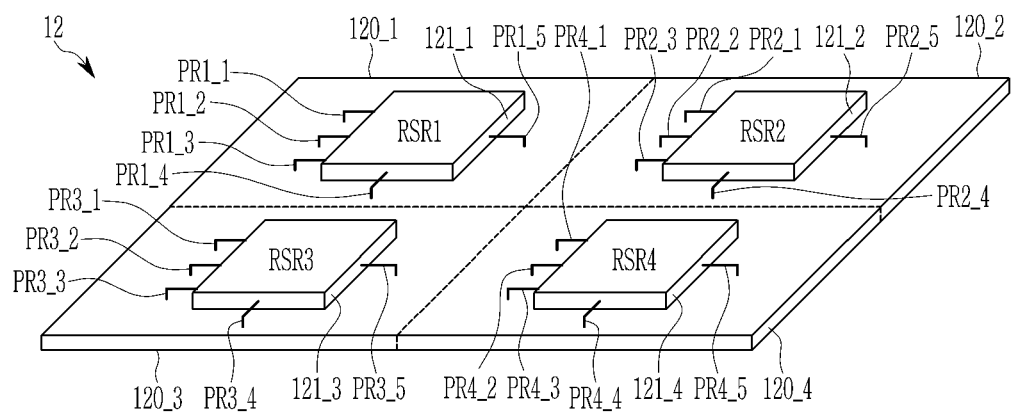
FIG. 2A illustrates a perspective view of a transplantation substrate of FIG. 1.

FIG. 2A illustrates a perspective view of a transplantation substrate of FIG. 1.

Figure 2B:
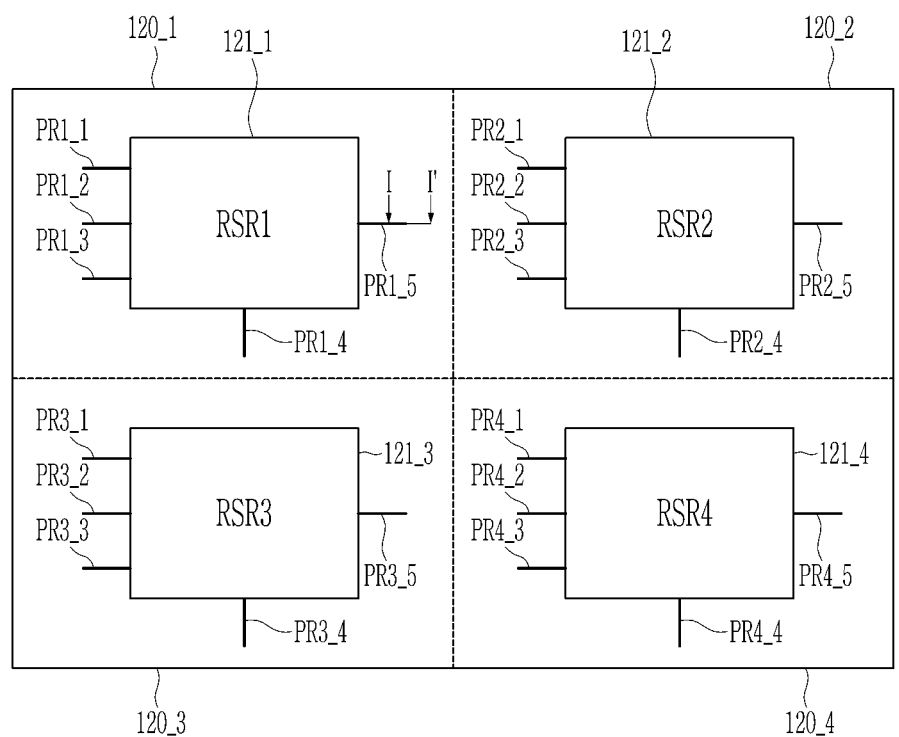
FIG. 2B illustrates a top plan view of the transplantation substrate of FIG. 2A as viewed from above.

FIG. 2B illustrates a top plan view of the transplantation substrate of FIG. 2A as viewed from above.

The implanted substrate 12 may include a plurality of replacement shift registers 121_1 to 121_4 (121_1, 121_2, 121_3, and 121_4). Each of the replacement shift registers 121_1 to 121_4 (e.g., 121_1) may include corresponding pins (e.g., PR1_1 to PR1_5) among pins PR1_1 to PR1_5 (PR1_1, PR1_2, PR1_3, PR1_4, and PR1_5), PR2_1 to PR2_5 (PR2_1, PR2_2, PR2_3, PR2_4, and PR2_5), PR3_1 to PR3_5 (PR3_1, PR3_2, PR3_3, PR3_4, and PR3_5), and PR4_1 to PR4_5 (PR4_1, PR4_2, PR4_3, PR4_4, and PR4_5) to be inserted into a hole of the transplantation substrate 12. The transplantation substrate 12 may be divided into a region in which each of the replacement shift registers 121_1, to 121_4 may be mounted and a plurality of regions 120_1 to 120_4 each including a predetermined extra space from the mounted region. Each of the regions 120_1 to 120_4 of the transplantation substrate 12 may be separated from the transplantation substrate 12 by the cutting unit 134. Each of the regions 120_1 to 120_4 may include a plurality of holes and a plurality of pads. The holes are regions for inserting the pins PR1_1 to PR1_5, PR2_1 to PR2_5, PR3_1 to PR3_5, and PR4_1 to PR4_5, and each of the pads may be a region connecting each of the pins PR1_1 to PR1_5, PR2_1 to PR2_5, PR3_1 to PR3_5, and PR4_1 to PR4_5 to a corresponding one of wires patterned on the main substrate 11. For example, the cutting unit 134 may separate the region 120_1 in which the replacement shift register 121_1 may be mounted from the transplantation substrate 12.

Figure 2C:
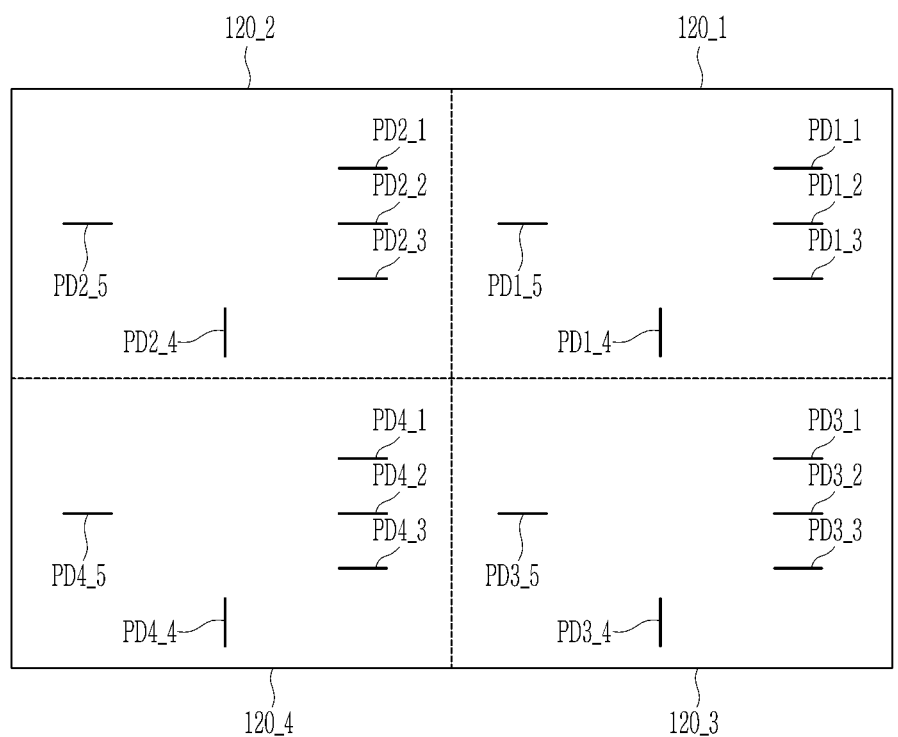
FIG. 2C illustrates a bottom view of the transplantation substrate of FIG. 2A as viewed from below.

FIG. 2C illustrates a bottom view of the transplantation substrate of FIG. 2A as viewed from below.

Corresponding pads (e.g., PD1_1 to PD1_5) among a plurality of pads PD1_1 to PD1_5 (PD1_1, PD1_2, PD1_3, PD1_4, and PD1_5), PD2_1 to PD2_5 (PD2_1, PD2_2, PD2_3, PD2_4, and PD2_5), PD3_1 to PD3_5 (PD3_1, PD3_2, PD3_3, PD3_4, and PD3_5), and PD4_1 to PD4_5 (PD4_1, PD4_2, PD4_3, PD4_4, and PD4_5) may be formed at a lower end of each of the regions 120_1 to 120_4 (e.g., 120_1).

The input and output lines of each of the replacement shift registers 121_1 to 121_4 may include corresponding pins among the pins PR1_1 to PR1_5, PR2_1 to PR2_5, PR3_1 to PR3_5, and PR4_1 to PR4_5 and corresponding pads of the pads PD1_1 to PD1_5, PD2_1 to PD2_5, PD3_1 to PD3_5, and PD4_1 to PD4_5. For example, a first input line of the replacement shift register 121_1 may include a pin PR1_1 and a pad PD1_1, a second input line of the replacement shift register 121_1 may include a pin PR1_2 and a pad PD1_2, a third input line of the replacement shift register 121_1 may include a pin PR1_3 and a pad PD1_3, a fourth input line of the replacement shift register 121_1 may include a pin PR1_4 and a pad PD1_4, and an output line of the replacement shift register 121_1 may include a pin PR1_5 and a pad PD1_5.

Hereinafter, a state in which the pin PR1_5 of the replacement shift register 121_1 may be mounted on the transplantation substrate 12 will be described with reference to FIG. 2D which may be a cross-sectional view of a portion I-I'.

Figure 2D:
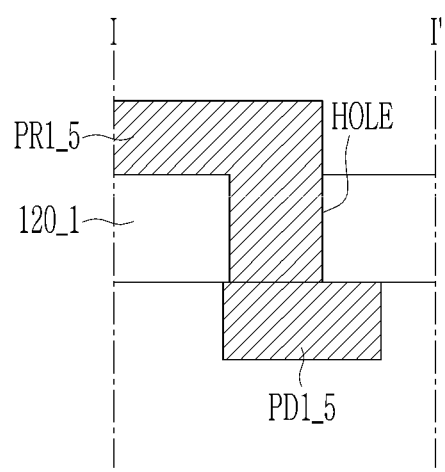
FIG. 2D illustrates a cross-sectional view of line I-I' of FIG. 2B.

FIG. 2D illustrates a cross-sectional view of line I-I' of FIG. 2B.

Referring to FIG. 2D, the pin PR1_5 may be inserted into a hole of the region 120_1 to be connected to the pad PD1_5 at a lower end of the region 120_1. As such, each of the pins PR1_1 to PR1_5, PR2_1 to PR2_5, PR3_1 to PR3_5, and PR4_1 to PR4_5 may be inserted into a hole to be connected to a corresponding pad among the pads PD1_1 to PD1_5, PD2_1 to PD2_5, PD3_1 to PD3_5, and PD4_1 to PD4_5, respectively.

Figure 3:
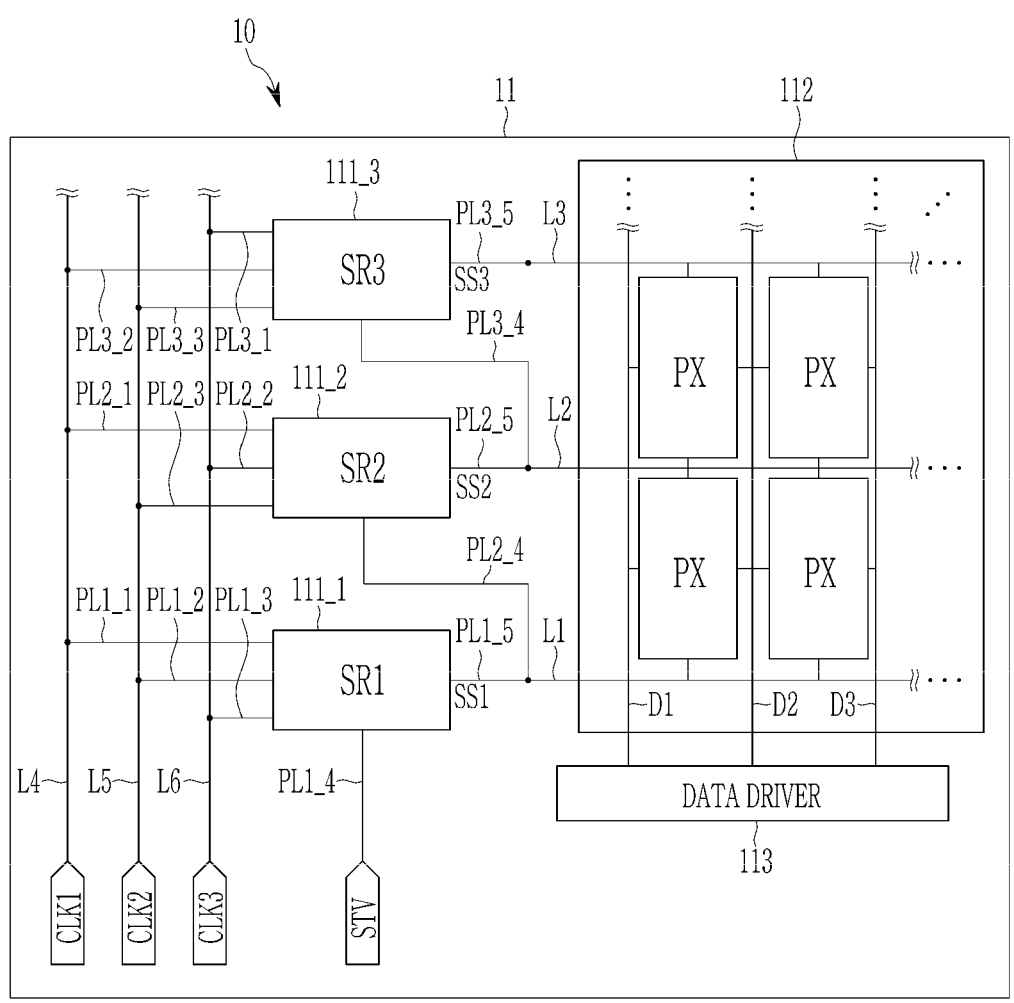
FIG. 3 illustrates a block diagram schematically showing signal lines inputted to a plurality of shift registers in a display device.

FIG. 3 illustrates a block diagram schematically showing signal lines inputted to a plurality of shift registers in a display device. Hereinafter, three shift registers among the plurality of shift registers are illustrated in FIG. 3 for convenience of description.

The display device 10 may include a main substrate 11. The main substrate 11 may include three shift registers (SR) 111_1, 111_2, and 111_3, a display panel 112, and a data driver 113.

The display panel 112 may include a plurality of pixels PX each connected to a corresponding one of a plurality of scan lines SCAN1, SCAN2, and SCAN3 and a corresponding one of the plurality of data lines D1, D2, and D3. The pixels PX each may emit light depending on a data signal transferred through a corresponding data line in synchronization with an on level of a scan signal transferred through a corresponding scan line, thereby displaying an image on the display device 10. FIG. 3 illustrates numbers of scan lines and data lines as three, but this may be for convenience of description, and the numbers of scan lines and data lines may be two or more.

The data driver 113 may be connected to the respective pixels PX of the display panel 112 through the data lines D1, D2, and D3.

A plurality of wires PL1_1 to PL1_5 (PL1_1, PL1_2, PL1_3, PL1_4, and PL1_5) patterned on the main substrate 11 may be input and output lines of the shift register 111_1, a plurality of patterned wires PL2_1 to PL2_5 (PL2_1, PL2_2, PL2_3, PL2_4, and PL2_5) may be input and output lines of the shift register 111_2, and a plurality of patterned wires PL3_1 to PL3_5 (PL3_1, PL3_2, PL3_3, PL3_4, and PL3_5) may be input and output lines of the shift register 111_3.

A plurality of shift registers 111_1, 111_2, and 111_3 may receive a plurality of clock signals CLK1, CLK2, and CLK3 and a start signal through the patterned wires PL1_1 to PL1_5, PL2_1 to PL2_5, and PL3_1 to PL3_5, and may generate a plurality of scan signals SS1, SS2, and SS3 to transfer them to a plurality of scan lines L1, L2, and L3. The shift register 111_1 that generates the first scan signal in one frame among the plurality of shift registers 111_1, 111_2, and 111_3 may receive a start signal having an on level pulse for each frame. The remaining shift registers 111_2 and 111_3 may receive a scan signal that may be an output of a shift register positioned in an immediately preceding stage as a start signal. Each of the shift registers 111_1, 111_2, and 111_3 may be synchronized with an on level edge of a signal inputted as a start signal to output at least one cycle of a clock signal among the clock signals CLK1, CLK2, and CLK3 as a scan signal. For example, the shift register 111_1 may output one cycle of a clock signal CLK1 as a scan signal SS1 in synchronization with an on level edge of a start signal STV, the shift register 111_2 may output one cycle of a clock signal CLK2 as a scan signal SS2 in synchronization with an on level edge of the scan signal SS1, and the shift register 111_3 may output one cycle of a clock signal CLK3 as a scan signal SS3 in synchronization with an on level edge of the scan signal SS2.

The wire L1 may be connected to the wire PL1_5. The wire L2 may be connected to the wire PL2_5. The wire L3 may be connected to the wire PL3_5.

The wire L4 may be connected to each of patterned wires PL1_1, PL2_1, and PL3_2. The wire L5 may be connected to each of patterned wires PL1_2, PL2_3, and PL3_3. The wire L6 may be connected to each of patterned wires PL1_3, PL2_2, and PL3_1.

Each of the wires L4, L5, and L6 of the clock signals CLK1, CLK2, and CLK3 and a wire PL3_4 of a register start signal STV may be formed on the same layer as a source-drain wire connected to a source or drain of the transistor of a pixel circuit constituting the pixel PX. The patterned wires PL1_1 to PL1_5, PL2_1 to PL2_5, and PL3_1 to PL3_5 may also be source-drain wires. The wire L1, L2, and L3 connected to the display panel 112 may be formed on a same layer as that of a gate wires connected to a gate of a pixel circuit. A plurality of contact holes are formed between a layer in which the gate wire may be formed and a layer in which the source-drain wire may be formed, and some of the contact holes may be formed between the wire PL1_5 and the wire L1, between the wire PL2_5 and the wiring L2, and at a corresponding position to connect the wire PL3_5 and the wire L3.

Hereinafter, the main substrate 11 on which a target replacement shift register may be transplanted will be described with reference to FIG. 4A and FIG. 4B.

Figure 4A:
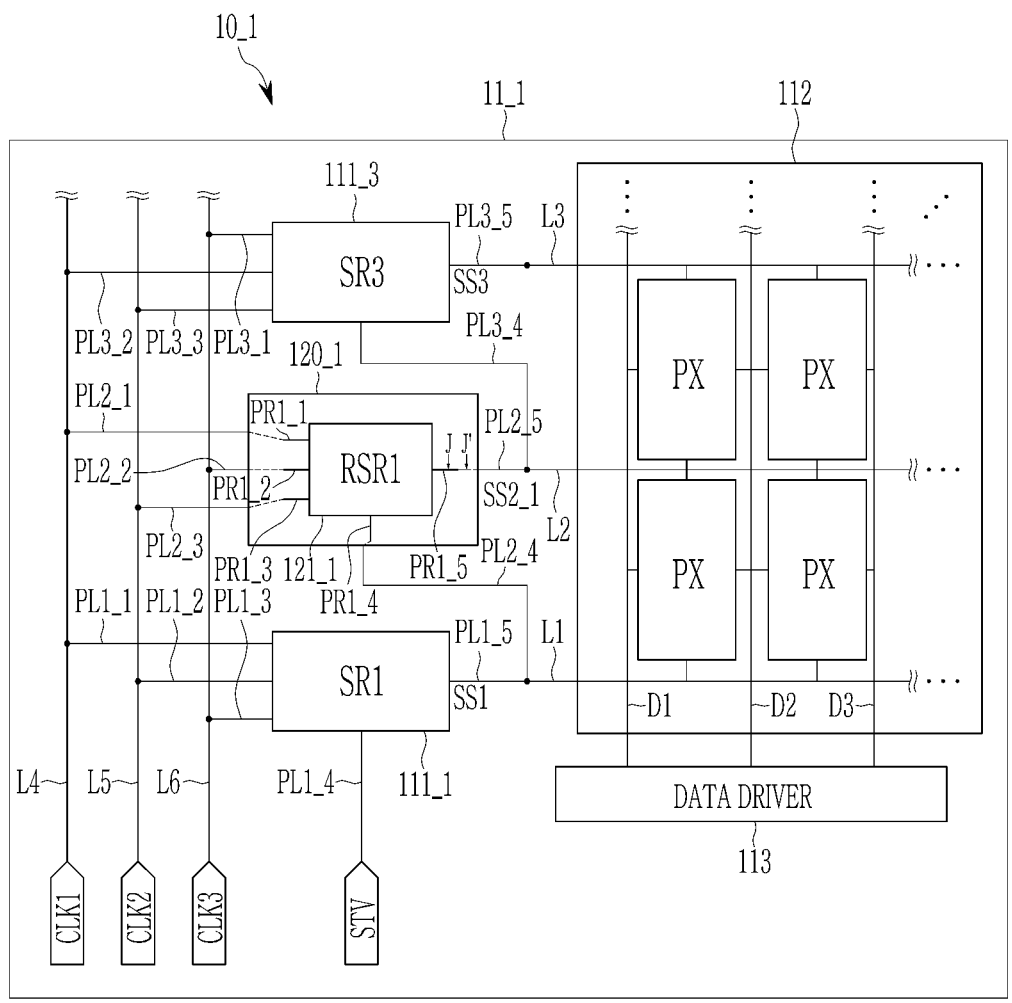
FIG. 4A illustrates a block diagram schematically showing a display device in which a replacement shift register is implanted in a main substrate of FIG. 3.

FIG. 4A illustrates a block diagram schematically showing a display device in which a replacement shift register may be implanted in a main substrate of FIG. 3.

Hereinafter, for convenience of description, a main substrate on which a replacement shift register may be transplanted may be referred to as a main substrate 11_1 among main substrates 11, and a display device including the main substrate 11_1 among the display devices 10 may be referred to as a display device 10_1.

The display device 10_1 may include the main substrate 11_1. The main substrate 11_1 may include two shift registers (SR) 111_1 and 111_2, a replacement shift register (RSR) 121_1, a display panel 112, and a data driver 113.

Hereinafter, one replacement shift register 121_1 among a plurality of replacement shift registers may be illustrated in FIG. 4A for convenience of description. In above descriptions of the plurality of shift registers 111_1 and 111_3, the display panel 112, and the data driver 113, overlapping contents may be omitted.

When a defect occurs in the shift register 111_2 of FIG. 3, the cutting unit 134 cuts input and output lines of the shift register 111_2 with a laser, and the connector 133 may laser weld the replacement shift register 121_1 to a line remaining on the main substrate 11 after being cut among the input and output lines of the shift register 111_2.

Alternatively, when a defect occurs in the shift register 111_2 of FIG. 3, the connector 133 may laser weld the replacement shift register 121_1 to input and output lines of the shift register 111_2 in a state in which the input/output lines of the shift register 111_2 are not cut.

The replacement shift register 121_1 may be a shift register mounted in the region 120_1 separated from the transplantation substrate 12 among the regions 120_1 to 120_4 of the transplantation substrate 12.

The input and output lines of the replacement shift register 121_1 may be connected to patterned wires PL2_1 to PL2_5 corresponding to the shift register 111_2.

A pin PR1_1 may be connected to the patterned wire PL2_1. A pin PR1_1 may be connected to the patterned wire PL2_1. A pin PR1_2 may be connected to the patterned wire PL2_2. A pin PR1_3 may be connected to the patterned wire PL2_3. A pin PR1_4 may be connected to the patterned wire PL2_4. A pin PR1_5 may be connected to the patterned wire PL2_5.

Hereinafter, a state in which the pin PR1_5 of the replacement shift register 121_1 may be mounted on the main substrate 11 will be described with reference to FIG. 4B which may be a cross-sectional view of line J-J'.

Figure 4B:
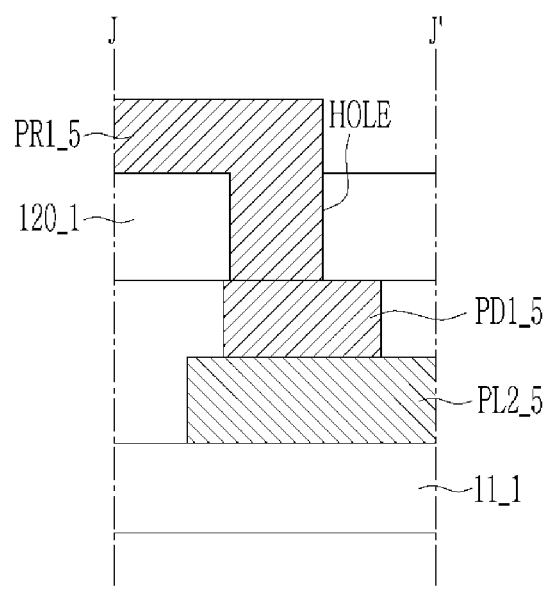
FIG. 4B illustrates a cross-sectional view of line J-J' of FIG. 4A.

FIG. 4B illustrates a cross-sectional view of line J-J' of FIG. 4A.

Referring to FIG. 4B, the pin PR1_5 may be inserted into a hole of the region 120_1 to be connected to the pad PD1_5 at a lower end of the region 120_1. The pad PD1_5 may be connected to the patterned wire PL2_5 on the main substrate 11_1. As such, each of the pins PR1_1 to PR1_5 may be inserted into a hole of the region 120_1 and connected to a corresponding pad among the pads PD1_1 to PD1_5, and each of the pads PD1_1 to PD1_5 may be connected to a corresponding patterned wire among the patterned wires PL2_1 to PL2_5.

In the main substrate 11_1, the replacement shift register 121_1 may receive a scan signal that may be an output of a shift register positioned in an immediately preceding stage as a start signal. The replacement shift register 121_1 may output at least one cycle of a clock signal among the clock signals CLK1, CLK2, and CLK3 as a scan signal SS2_1 in synchronization with an on-level edge of a signal inputted as a start signal. For example, the shift register 111_1 may output one cycle of a clock signal CLK1 as a scan signal SS1 in synchronization with an on level edge of a start signal STV, the replacement shift register 121_1 may output one cycle of a clock signal CLK2 as a scan signal SS2_1 in synchronization with an on level edge of the scan signal SS1, and the shift register 111_3 may output one cycle of a clock signal CLK3 as a scan signal SS3 in synchronization with an on level edge of the scan signal SS2_1.

Herein, the scan signal SS2_1 may be the same as the scan signal SS2 when the shift register 111_2 may be not defective in FIG. 3.

Hereinafter, a shift register repairing method using a shift register transplanting system according to an embodiment will be described with reference to FIG. 5 and FIG. 6. Hereinafter, a description of a portion overlapping the previous description may be omitted.

Figure 5:
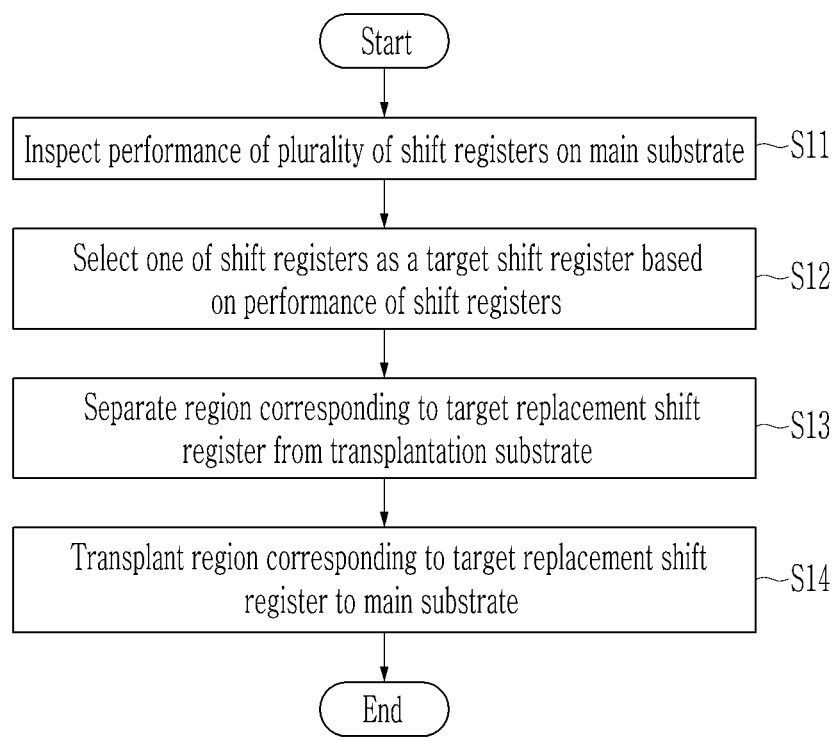
FIG. 5 illustrates a flowchart of a shift register repairing method according to an embodiment.

FIG. 5 illustrates a flowchart of a shift register repairing method according to an embodiment.

For convenience of description, a description will be made based on the inspection device 13 of FIG. 1, the display device 10 of FIG. 3, and the display device 10_1 of FIG. 4.

The sensor unit 132 may inspect performance of a plurality of shift registers 111_1 to 111_n on the main substrate 11 (S11). For example, the sensor unit 132 may find a pixel row that does not emit light depending on a test image signal that may be a basis of a test image from the test image displayed by the display device 10, and may determine that a shift register connected to the pixel row may be defective.

The sensor unit 132 may select one of the shift registers 111_1 to 111_n as a target shift register 111_i based on the performance of the shift registers 111_1 to 111_n (S12). For example, when it may be determined that the shift register 111_2 among the shift registers 111_1 to 111_n may be defective, the sensor unit 132 may select the shift register 111_2 as the target shift register 111_i.

The controller 131 may determine a region corresponding to a target replacement shift register 121_j of one of the regions 120_1 to 120_4 of the transplantation substrate 12. The cutting unit 134 may separate a region corresponding to the target replacement shift register 121_j from the transplantation substrate 12 (S13).

The connector 133 may transplant the region corresponding to the target replacement shift register 121_j to the main substrate 11 (S14). The connector 133 may connect each of the input and output lines PR2_1 to PR2_5 of the target replacement shift register 121_j to the input and output lines PL2_1 to PL2_5 of the target shift register 111_i. For example, the connector 133 may connect the input and output lines of the target replacement shift register 121_j to the input and output lines of the target shift register 111_i by assembling the region corresponding to the target replacement shift register 121_j on the main substrate 11.

The display device 10 of FIG. 3 may be changed to a shape of the display device 10_1 of FIG. 4 depending on steps S11, S12, and S13.

In the main substrate 11_1, the replacement shift register 121_1 may receive a scan signal that may be an output of a shift register positioned in an immediately preceding stage as a start signal. The replacement shift register 121_1 may output at least one cycle of a clock signal among the clock signals CLK1, CLK2, and CLK3 as a scan signal SS2_1 in synchronization with an on-level edge of a signal inputted as a start signal.

As such, the inspection device 13 may connect the target replacement shift register 121_j to the main substrate 11 in a state where the target shift register 111_i may be connected thereto. Alternatively, the inspection device 13 may cut the input and output lines of the target shift register 111_i from the main substrate 11, and may connect the target replacement shift register 121_j to the main substrate 11 in a state in which the input and output lines of the target shift register 111_i are cut. Hereinafter, a shift register repairing method according to an embodiment including cutting input and output lines of the target shift register 111_i will be described with reference to FIG. 6.

Figure 6:
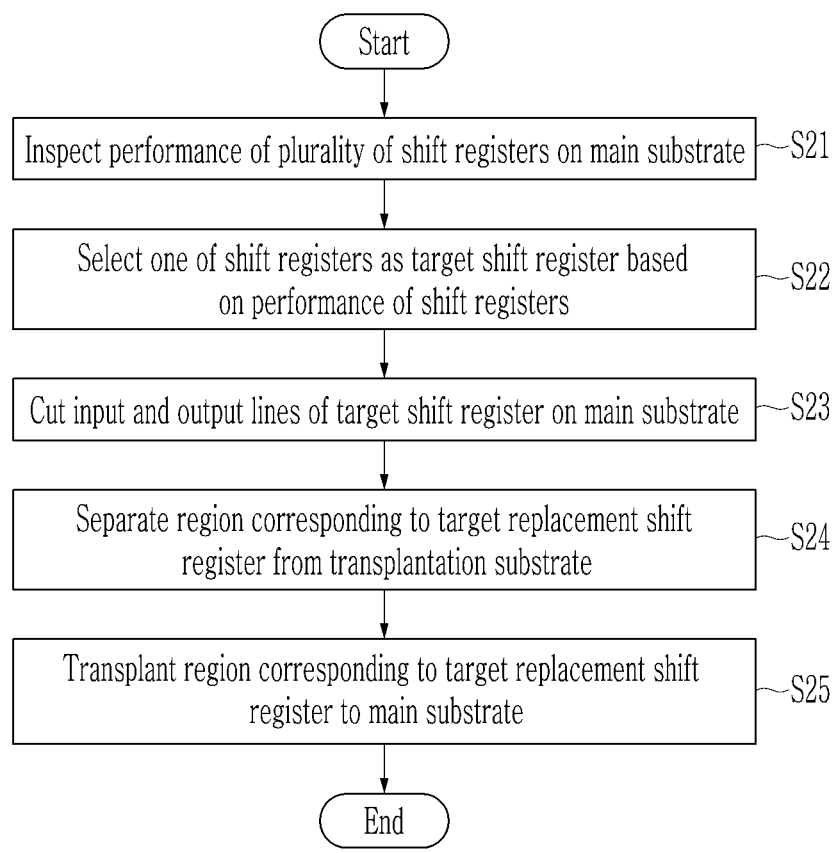
FIG. 6 illustrates a flowchart of a shift register repairing method according to an embodiment.

FIG. 6 illustrates a flowchart of a shift register repairing method according to an embodiment.

The sensor unit 132 may inspect performance of a plurality of shift registers 111_1 to 111_n on the main substrate 11 (S21).

The sensor unit 132 may select one of the shift registers 111_1 to 111_n as a target shift register 111_i based on the performance of the shift registers 111_1 to 111_n (S22).

The cutting unit 134 may cut the input and output lines of the target shift register 111_i on the main substrate 11 (S23). In the example of FIG. 4, the cutting unit 134 may cut the input and output lines PL2_1 to PL2_5 of the shift register 111_2. The cutting unit 134 may cut the input and output lines PL2_1 to PL2_5 of the shift register 111_2, and may remove the shift register 111_2 from the main substrate 11.

The controller 131 may determine a region corresponding to a target replacement shift register 121_1 of one of the regions 120_1 to 120_4 of the transplantation substrate 12. The cutting unit 134 may separate a region corresponding to the target replacement shift register 121_1 from the transplantation substrate 12 (S24).

The connector 133 may transplant the region corresponding to the target replacement shift register 121_j to the main substrate 11 (S25). The connector 133 may connect each of the input and output lines PR2_1 to PR2_5 of the target replacement shift register 121_1 to a line remaining on the main substrate 11 after being cut among the input and output lines PL2_1 to PL2_5 of the shift register 111_2.

The display device 10 of FIG. 3 may be changed to a shape of the display device 10_1 of FIG. 4 depending on steps S21, S22, S23, and S24.

In the main substrate 11_1, the replacement shift register 121_1 may receive a scan signal that may be an output of a shift register positioned in an immediately preceding stage as a start signal. The replacement shift register 121_1 may output at least one cycle of a clock signal among the clock signals CLK1, CLK2, and CLK3 as a scan signal SS2_1 in synchronization with an on-level edge of a signal inputted as a start signal.

While this disclosure has been described in connection with what may be presently considered to be practical embodiments, it may be to be understood that the disclosure may be not limited to the disclosed embodiments, but, on the contrary, may be intended to cover various modifications and equivalent arrangements included within the spirit and scope of the appended claims.

What is claimed is:

1. A shift register repairing method comprising steps of:
    inspecting, by an inspection device, performance of a plurality of shift registers, wherein the plurality of shift registers are configured to receive a plurality of clock signals and a start signal, to generate a plurality of scan signals, and to transfer the plurality of scan signals to a plurality of scan lines positioned in a first direction in a display panel positioned on a first substrate;
    selecting, by the inspection device, a first shift register from among the shift registers based on the performance of the shift registers;
    separating, by the inspection device, a region corresponding to a second shift register positioned on a second substrate from the second substrate; and
    transplanting, by the inspection device, the region corresponding to the second shift register to the first substrate.

2. The shift register repairing method of claim 1, wherein the inspecting is accomplished by:
    displaying, by a display device including the display panel, a test image depending on a test image signal; and
    photographing, by the inspection device, the test image to find a pixel row that does not emit light depending on the test image signal from the test image.

3. The shift register repairing method of claim 2, wherein the first shift register is a shift register connected to the pixel row that does not emit light among the shift registers.

4. The shift register repairing method of claim 1, wherein the transplanting is accomplished by connecting the second shift register to input and output lines of the first shift register through a contact hole formed in a region corresponding to the second shift register.

5. The shift register repairing method of claim 1, further comprising a step of:
    receiving, by the second shift register, a first scan signal outputted from a third shift register positioned in an immediately preceding stage of the first shift register among the shift registers as a start signal, and outputting at least one cycle of one of the clock signals as a second scan signal in synchronization with the first scan signal.

6. The shift register repairing method of claim 1, further comprising a step of:
    receiving, by a third shift register positioned in an immediately following stage of the first shift register among the shift registers, the first scan signal outputted from the second shift register as a start signal, and outputting at least one cycle of one of the clock signals as a second scan signal in synchronization with the first scan signal.

7. A shift register repairing method comprising steps of:
    inspecting, by an inspection device, performance of a plurality of shift registers, wherein the plurality of shift registers is configured to receive a plurality of clock signals and a start signal, to generate a plurality of scan signals, and to transfer the plurality of scan signals to a plurality of scan lines positioned in a first direction in a display panel positioned on a first substrate;
    selecting, by the inspection device, one first shift register from among the shift registers based on the performance of the shift registers;
    cutting, by the inspection device, input and output lines of the first shift register;
    separating, by the inspection device, a region corresponding to a second shift register positioned on a second substrate from the second substrate; and
    transplanting, by the inspection device, a region corresponding to the second shift register to a line remaining on the first substrate after being cut among input and output lines of the first shift register.

8. The shift register repairing method of claim 7, wherein the inspecting is accomplished by:

displaying, by a display device including the display panel, a test image depending on a test image signal, and photographing, by the inspection device, the test image to find a pixel row that does not emit light depending on the test image signal from the test image.

9. The shift register repairing method of claim 8, wherein the first shift register is a shift register connected to the pixel row that does not emit light among the shift registers.

10. The shift register repairing method of claim 7, wherein the cutting of the input and output lines of the first shift register is accomplished by laser cutting the input and output lines of the first shift register, and removing the first shift register from the first substrate.

11. The shift register repairing method of claim 7, wherein each of a plurality of pins of the second shift register is connected to a pad through a contact hole formed in a region corresponding to the second shift register, and the transplanting is accomplished by connecting the pad to a line remaining on the first substrate among input and output lines of the first shift register.

12. The shift register repairing method of claim 7, wherein the region corresponding to the second shift register includes:

a plurality of contact holes into which a plurality of pins of the second shift register are inserted; and a plurality of pads connecting the pins to a wire patterned in the first substrate.

13. The shift register repairing method of claim 7, further comprising a step of:

receiving, by the second shift register, a first scan signal outputted from a third shift register positioned in an immediately preceding stage of the first shift register as a start signal, and outputting at least one cycle of one of the clock signals as a second scan signal in synchronization with the first scan signal.

14. The shift register repairing method of claim 7, further comprising a step of:

receiving, by a third shift register positioned in an immediately following stage of the first shift register, the first scan signal outputted from the second shift register as a start signal, and outputting at least one cycle of one of the clock signals as a second scan signal in synchronization with the first scan signal.

\* \* \* \* \*